United States Patent [19]

Jackson

[11] Patent Number: 5,243,348
[45] Date of Patent: Sep. 7, 1993

[54] PARTITIONED DIGITAL ENCODER AND METHOD FOR ENCODING BIT GROUPS IN PARALLEL

[75] Inventor: H. Spence Jackson, Austin, Tex.
[73] Assignee: Motorola, Inc., Schaumburg, Ill.
[21] Appl. No.: 873,868
[22] Filed: Apr. 27, 1992
[51] Int. Cl.$^5$ .......................................... H03M 7/14
[52] U.S. Cl. ...................... 341/64; 341/160
[58] Field of Search ............. 341/160, 63, 97, 64

[56] References Cited

U.S. PATENT DOCUMENTS

| | | | |
|---|---|---|---|
| 3,721,975 | 3/1973 | Brinkman et al. | 341/156 |
| 4,101,934 | 7/1978 | Fukuoka | 358/261 |
| 4,211,999 | 7/1980 | Clark et al. | 341/160 |
| 4,586,025 | 4/1986 | Knierim | 341/64 |
| 4,887,084 | 12/1989 | Yamaguchi | 341/160 |
| 5,155,489 | 10/1992 | Gulczynski | 341/160 |

*Primary Examiner*—Marc S. Hoff
*Attorney, Agent, or Firm*—Robert L. King

[57] ABSTRACT

A digital encoder (34) is partitioned into a plurality of rank ordered encoder circuits (36-39) which concurrently encodes least significant bits of an input signal from a first digital format to an output signal in a second digital format. Simultaneously, at least one bit of the input signal is used by a most significant bit encoder (42) to provide at least one most significant bit of the input signal in the second digital format. The at least one most significant bit is also used to select an output encoding of one of the plurality of rank ordered encoder circuits (36-39) as a remainder of the bits of the output signal in the second digital format.

11 Claims, 4 Drawing Sheets

| INPUT | OUTPUT |
|---|---|
| 0 0 0 0 0 0 0 0 0 0 0 0 0 0 0 | 0 0 0 0 |
| 0 0 0 0 0 0 0 0 0 0 0 0 0 0 1 | 0 0 0 1 |
| 0 0 0 0 0 0 0 0 0 0 0 0 0 1 1 | 0 0 1 0 |
| 0 0 0 0 0 0 0 0 0 0 0 0 1 1 1 | 0 0 1 1 |
| 0 0 0 0 0 0 0 0 0 0 0 1 1 1 1 | 0 1 0 0 |
| 0 0 0 0 0 0 0 0 0 0 1 1 1 1 1 | 0 1 0 1 |
| 0 0 0 0 0 0 0 0 0 1 1 1 1 1 1 | 0 1 1 0 |
| 0 0 0 0 0 0 0 0 1 1 1 1 1 1 1 | 0 1 1 1 |
| 0 0 0 0 0 0 0 1 1 1 1 1 1 1 1 | 1 0 0 0 |
| 0 0 0 0 0 0 1 1 1 1 1 1 1 1 1 | 1 0 0 1 |
| 0 0 0 0 0 1 1 1 1 1 1 1 1 1 1 | 1 0 1 0 |
| 0 0 0 0 1 1 1 1 1 1 1 1 1 1 1 | 1 0 1 1 |
| 0 0 0 1 1 1 1 1 1 1 1 1 1 1 1 | 1 1 0 0 |
| 0 0 1 1 1 1 1 1 1 1 1 1 1 1 1 | 1 1 0 1 |
| 0 1 1 1 1 1 1 1 1 1 1 1 1 1 1 | 1 1 1 0 |
| 1 1 1 1 1 1 1 1 1 1 1 1 1 1 1 | 1 1 1 1 |

*FIG.3*

PARTITIONED DIGITAL ENCODER AND METHOD FOR ENCODING BIT GROUPS IN PARALLEL

FIELD OF THE INVENTION

The present invention generally relates to data converters, and more specifically to digital encoders.

BACKGROUND OF THE INVENTION

Flash analog-to-digital (A/D) converters, so called because a converted output can be quickly provided, are well known. Flash A/D converters utilize either resistors or capacitors to develop a comparison voltage for comparison with a sampled input voltage. A plurality of comparators is used to develop an equivalent digital representation of the sampled input voltage. A common data format of the digital equivalent is known as the "thermometer" format or code because the digital representation consistently uses logic one values in all LSB least significant bit locations below the most significant one to represent every magnitude which may be represented by the format. In other words, the binary representation of thermometer format uses logic ones from left to right as the magnitude being represented increases. Because this representation is similar to the way a thermometer represents temperature, the representation is commonly referred to as thermometer in the literature.

The thermometer format is advantageous to use with flash A/D converter because of the direct proportionality associated with the A/D conversion. However, before the digital representation can be used the digital value must be converted to the common binary format. Others have converted from thermometer to binary format in one of several ways. A first known technique is to first convert from the thermometer format to an intermediate code, such as the conventional Gray code format, and then convert the intermediate code format to binary format. The first technique has the disadvantage of having to make two conversions. A second known technique is to directly convert from thermometer code to binary code. However, existing techniques to accomplish a direct conversion have a significant speed disadvantage. A most significant bit (MSB) is easy to decode from thermometer to binary. However, the conversion of least significant bits (LSBs) requires information from most of the thermometer bits. For example, a six bit flash converter requires up to six logic circuit processing delays in order to decode the least significant bit. Therefore, known digital encoders typically require a significant amount of time and/or circuitry to implement digital format conversions.

SUMMARY OF THE INVENTION

In accordance with the invention, there is provided a digital encoder and method of operation for encoding a plurality of digital bits from a first digital code format to a second digital code format. An input terminal is provided for receiving a digital input signal in the first digital code format, the digital input signal having a plurality of digital bits. A plurality of rank ordered encoder circuits is provided, each of the rank ordered encoder circuits having an input coupled to the input terminal for receiving a predetermined portion of the digital bits corresponding to each of the rank ordered encoder circuits. Each encoder circuit provides an output in response to performing an encoding of the predetermined portion of the digital bits from the first digital code format to the second digital code format. A bit determination means is coupled to the input terminal for determining at least one most significant bit of the second digital code format. A means is coupled to each of the plurality of rank ordered encoder circuits for selecting the encoding of one of the encoder circuits in response to the at least one most significant bit of the second digital code format as a remainder of the second digital code format.

These and other features, and advantages, will be more clearly understood from the following detailed description taken in conjunction with the accompanying drawings. It is important to point out that there may be other embodiments of the present invention which are not specifically illustrated.

BRIEF DESCRIPTION OF THE DRAWINGS

FIG. 3 illustrates in table form an encoding from thermometer format to binary code format as performed by the encoder of FIG. 2.

DETAILED DESCRIPTION OF A PREFERRED EMBODIMENT

Figure 1:
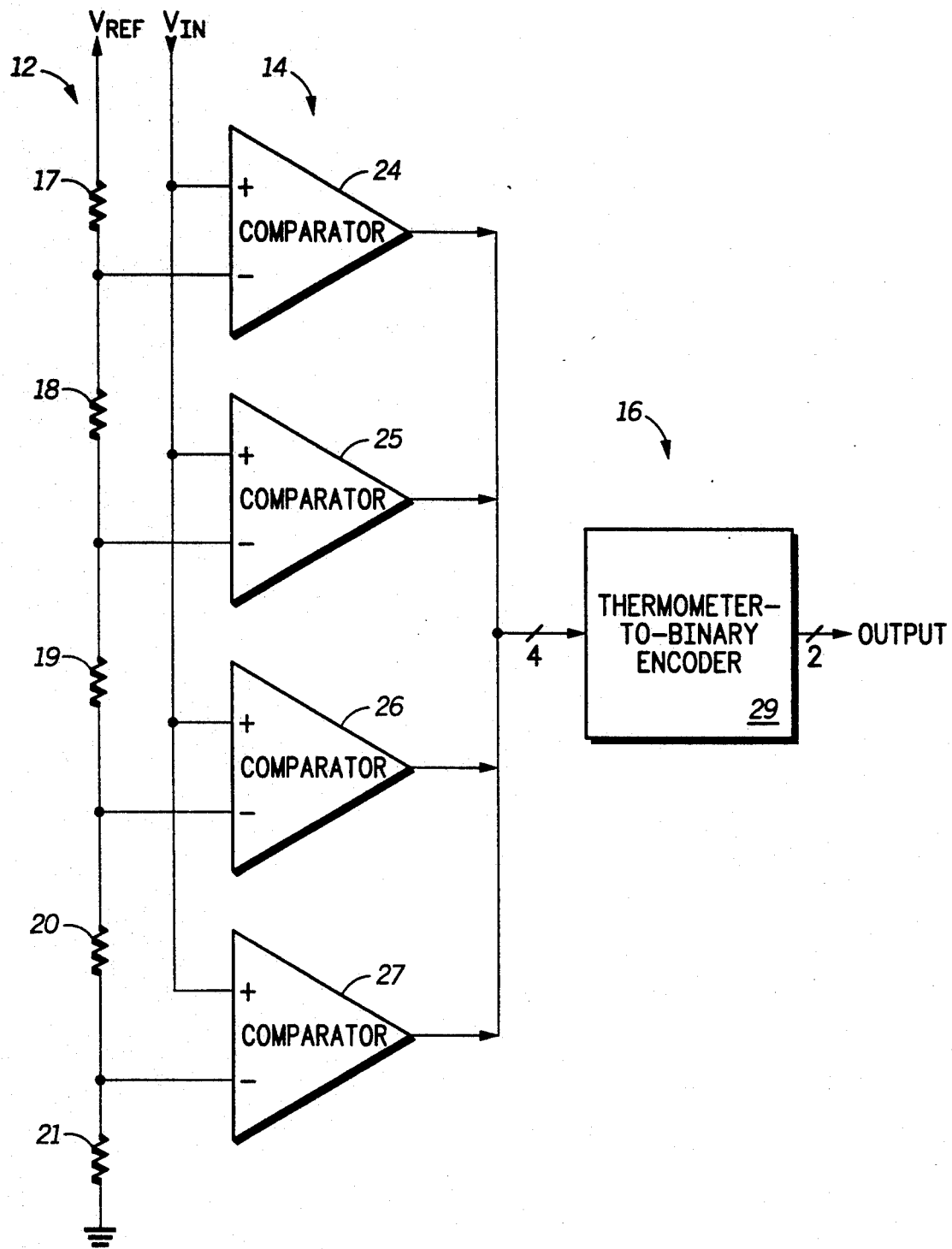
FIG. 1 illustrates in partial schematic form a known flash A/D converter.

Illustrated in FIG. 1 is a known flash A/D converter 10 for converting an analog input voltage, $V_{IN}$, to a digital equivalent labeled "OUTPUT." Generally, A/D converter 10 has a resistor ladder portion 12, a compare portion 14, and an encode portion 16. Within resistor ladder portion 12 is a plurality of resistors 17–21 which are connected in series between a positive reference voltage, $V_{REF}$, and an analog ground. Within compare portion 14 is a plurality of comparators 24–27, each having an output to form an output of compare portion 14. A first terminal of resistor 17 is connected to the reference voltage. A second terminal of resistor 17 is connected to both a first terminal of resistor 18 and an inverting or negative input of comparator 24. A second terminal of resistor 18 is connected to both a first terminal of resistor 19 and an inverting input of comparator 25. A second terminal of resistor 19 is connected to both a first terminal of resistor 20 and to an inverting input of comparator 26. A second terminal of resistor 20 is connected to both a first terminal of resistor 21 and to an inverting input of comparator 27. second terminal of resistor 21 is connected to the analog ground. Each of comparators 24–27 has a noninverting or positive input connected together to the analog input voltage, $V_{IN}$. Each of comparators 24–27 has an output connected to an input of a thermometer-to-binary encoder 29 which has an output for providing a digital equivalent output of the analog input voltage in a binary format.

In operation, converter 10 functions as a flash converter to quickly provide a digital equivalent of the analog input voltage in thermometer format at the output of compare portion 14. Predetermined reference voltages which vary in value between $V_{REF}$ and ground are coupled to each of the negative inputs of comparators 24–27. Each comparator compares one of the predetermined reference voltage values with the analog input voltage, $V_{IN}$, to generate a bit of a four-bit digital output. The output of compare portion 14 accordingly can vary between 0000, 0001, 0011, 0111, or 1111. This format is characteristic of the thermometer format. Encoder 29 functions to change the thermometer format to binary format so that the output of flash converter 10 may be readily used by conventional digital circuitry. The stated disadvantages associated with the known art as detailed above apply directly to encoder 29. As mentioned above, encoder 29 is typically implemented by performing an intermediate conversion or by performing a relatively slow conversion requiring information from most of the thermometer bits to determine the least significant bits. Since an encoder with four input bits is illustrated, it should be well understood that only a two-bit binary output is provided. Therefore, if it is desired to implement a large bit size converter, a significantly larger number of inputs is required which can dramatically increase the size of the circuitry required to perform an encoding.

Figure 2:
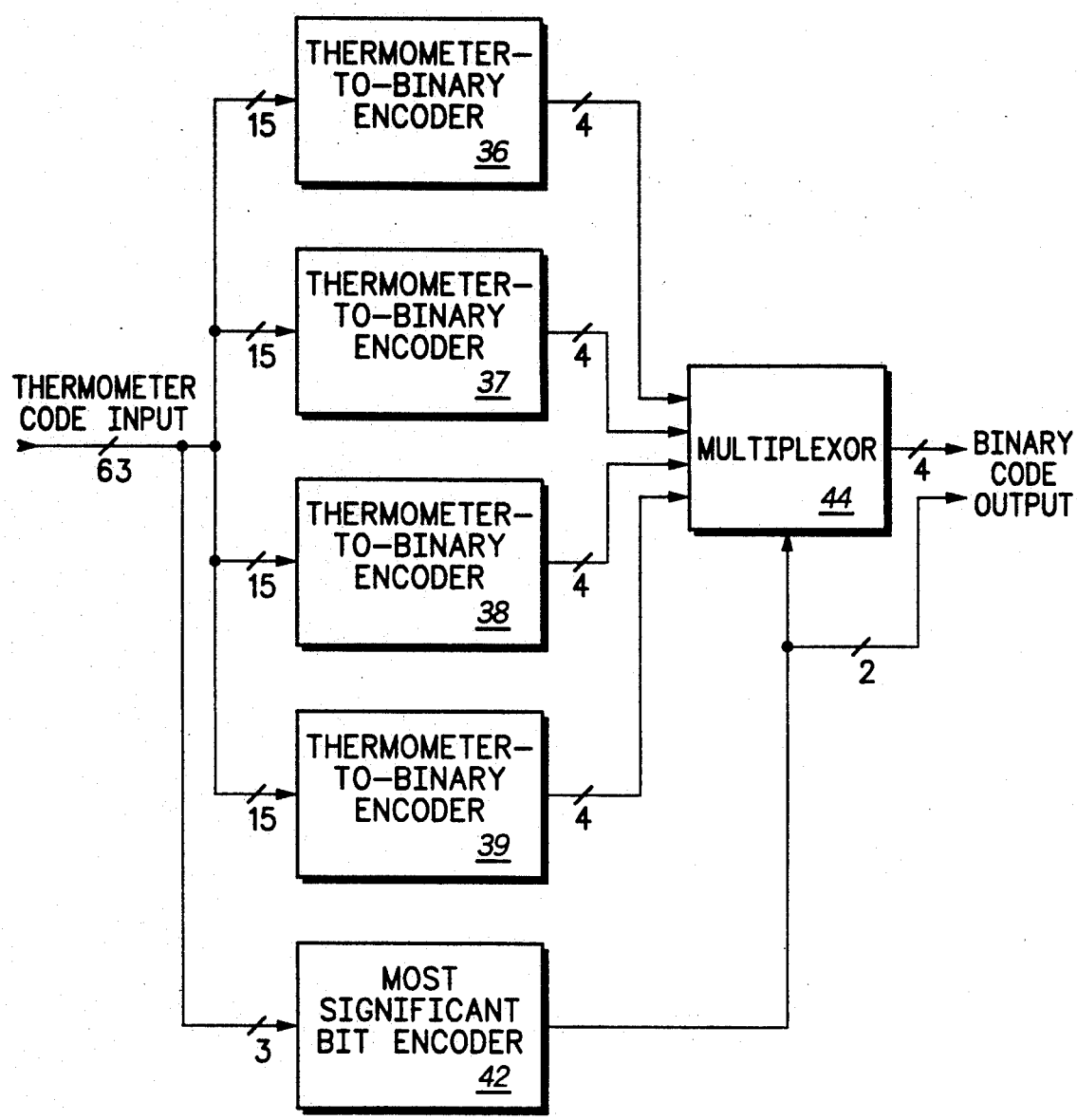
FIG. 2 illustrates in block diagram form a digital encoder in accordance with the present invention.

Illustrated in FIG. 2 is a partitioned digital encoder 34 in accordance with the present invention. Although specific bit sizes are illustrated for the purpose of better understanding the present invention, it should be well understood that the present invention is not limited to a particular bit size implementation. Encoder 34 has a thermometer code input terminal which receives a sixty-three bit digital signal, bits zero thru sixty-two, in thermometer code format. Typically, sixty-four codes are generated from a six-bit flash converter. However, since one of the bits corresponds to a zero code, one less conductor (i.e. only sixty-three conductors) is required in a conversion implementation.

A plurality of rank ordered encoder circuits 36-39 is provided wherein each of encoder circuits 36-39 has an input connected to the thermometer code input terminal of digital encoder 34. A most significant bit encoder 42 has an input connected to the input terminal. The most significant fifteen bits of the sixty-three bit input, bits forty-eight to sixty-two, are connected to encoder 36. Bit forty-seven of the sixty-three bit input is one of the three bits connected to the input of most significant bit encoder 42. The next most significant fifteen bits, bits thirty-two thru forty-six, are connected to the input of encoder 37. Bit thirty-one of the sixty-three bit input is another of the three bits connected to the input of most significant bit encoder 42. The next most significant fifteen bits, bits sixteen thru thirty, are connected to encoder 39. Bit fifteen of the sixty-three bit input is another of the three bits connected to the input of most significant bit encoder 42. The least significant fifteen bits, bits zero thru fourteen, are connected to encoder 39. The described bit partitioning is further illustrated in FIG. 4 as explained below. Each of encoders 36-39 has an output connected to a predetermined input of a multiplexor 44. An output of encoder 42 is connected to a control input of multiplexor 44. In the illustrated form, the output of encoder 42 is specified as being two bits. The output of most significant bit encoder 42 also functions directly as the most significant bit or bits of the equivalent binary output. An output of multiplexor 44 provides a remainder of the bits of the equivalent binary output.

In operation, the most significant bit encoder 42 functions to provide the most significant bit of the binary code output code. In the illustrated form, at least one more bit of the binary code output is provided, as most significant bit encoder 42 also provides the second most significant bit of the binary code output. Significant bit encoder 42 uses a number of input bits which is no greater in number than the plurality of thermometer-to-binary encoders 36-39. Concurrently, encoders 36-39 each function in a partitioned manner to encode the fifteen bits each encoder receives into a four-bit output. The four-bit output of each encoder is connected to multiplexor 44. One of the four-bit outputs from encoders 36-39 is selected by multiplexor 44 in response to the output of the most significant bit encoder 42. The output of multiplexor 44 is used as the least significant bits of the binary code output.

Illustrated in FIG. 3 is a truth table which represents the encoding performed by each of the thermometer-to-binary encoders 36-39. In the illustrated form there are sixteen possible codes for a fifteen-bit input. For each unique input there is a corresponding unique four-bit output which is provided by each of encoders 36-39. Therefore, depending upon which thermometer code input is received by each encoder, a corresponding binary code output is provided. Conventional encoding circuitry may be used to implement each of encoders 36-39 in accordance with the truth table of FIG. 3.

Figure 4:
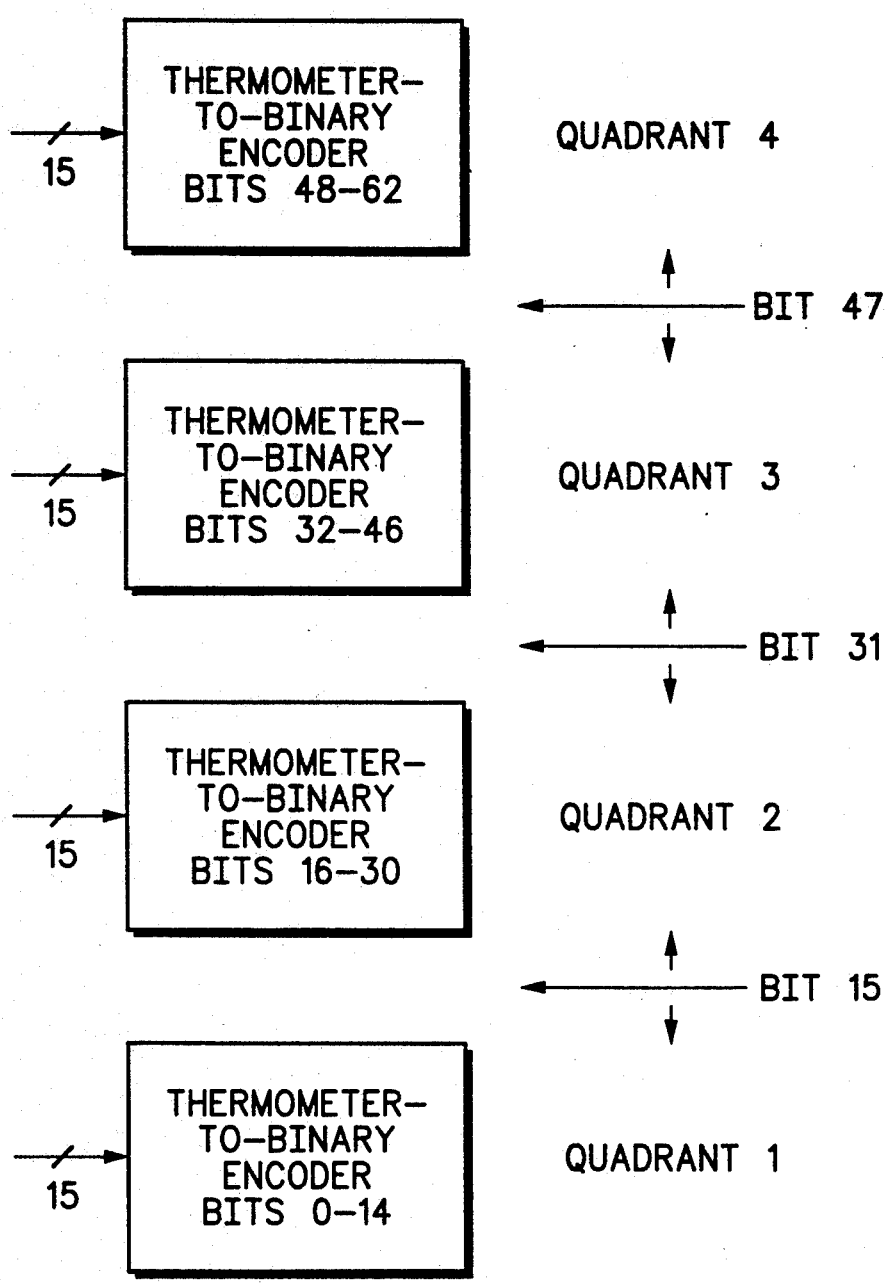
FIG. 4 illustrates in block diagram form division of the encoder of FIG. 2 into quadrants for most significant bit determination.

Illustrated in FIG. 4 is a representation of the partitioning of bits of the thermometer code bits among encoders 36-39 and encoder 42. In particular, it should be noted that in accordance with the present invention a predetermined number of encoders or quadrants is chosen. In the illustrated form, four quadrants are selected for the use with sixty-three bits. In FIG. 4 the bits zero thru fourteen are assigned to quadrant one or encoder 39. A boundary bit, bit fifteen, is not placed within a quadrant but is one of the three bits connected to most significant bit encoder 42. The bits sixteen thru thirty are assigned to quadrant two or encoder 38. A boundary bit, bit thirty-one, is not placed within a quadrant but is one of the three bits connected to most significant bit encoder 38. The bits thirty-two thru forty-six are assigned to quadrant four or encoder 36. A boundary bit, bit forty-seven, is not placed within a quadrant but is one of the three bits connected to most significant bit encoder 38. Therefore, FIG. 4 illustrates the bits in thermometer code in a form which can be easily analogized to a thermometer. For example, when bit fifteen is a logic zero, the value of the input lies somewhere in the first quadrant. When bit 31 is zero, the value of the input lies either in the first or second quadrant. Similarly, in order for the value of the input to be contained within the fourth quadrant, bit forty-seven must be a logic one.

In the illustrated form, most significant bit encoder 42 functions to provide the two most significant bits of the binary code output and to select one of the outputs of encoders 36-39 as the remaining bits (i.e. a remainder) of the binary code output. In order to determine what the most significant bit of the binary code output is, encoder 42 receives bit thirty-one. If bit thirty-one is a logic one, the most significant bit of the binary code output is a logic one. If bit thirty-one is a logic zero, the most significant bit of the binary code output is a logic zero. In order for the binary code output to have a MSB with a logic one value, the mid-point bit of the thermometer code input must always be a logic one. Otherwise, the MSB in binary code will be a logic zero.

In order to determine the second most significant bit in the binary code output which is provided by multiplexor 44, bits fifteen, thirty-one, and forty-seven must be examined. In order for the second most significant bit to be a logic one, the value of the thermometer code input must lie in either the second or the fourth quadrant. A determination of whether the input value is within the second quadrant is made by examining bits fifteen and thirty-one. The input value only falls within the second quadrant if bit fifteen is a logic one and bit thirty-one is a logic zero. The input value only falls within the fourth quadrant if bit forty-seven is a logic one. Standard encoding circuitry may be implemented within encoder 42 to make these determinations. By using all three of the bits fifteen, thirty-one, and forty-eight, a determination may be made as to exactly which quadrant the thermometer code input falls within. Therefore, the two-bit output of encoder 42 also may be used for the purpose of selecting one of the four quadrant outputs of encoders 36-39 corresponding to the equivalent quadrant which the input falls within. Therefore, a six bit binary code output has been provided concurrently and quickly as a result of the partitioned encoder.

By now it should be appreciated that there has been provided a partitioned encoder which is able to quickly convert between a first digital code format and a second digital code format. The present invention is particularly well adapted for thermometer code to binary code conversions commonly required in connection with flash data converters. Partitioning the inventive encoder into a plurality of individual encoders has numerous advantages. For example, the processing of the conversion of the least significant bits may be begun immediately without having to wait on most significant bit calculations before beginning processing of LSB conversion. The inventive encoder is extremely fast since the conversion of LSBs and MSBs occurs concurrently. Digital logic gate circuitry is simplified due to the partitioning. Because the input code is divided into a predetermined number of rank ordered groups for input to a corresponding number of rank ordered encoders, the number of gate inputs and the amount of gate logic delay may be optimized for any particular bit size input. Therefore, the present invention provides a digital encoder which may be optimized in a minimum amount of circuit area.

Thus it is apparent that there has been provided, in accordance with the invention, a digital encoder that fully meets the need and advantages set forth previously. Although the invention has been described and illustrated with reference to specific embodiments thereof, it is not intended that the invention be limited to these illustrative embodiments. For example, the number of rank ordered encoders 36-39 may be varied with respect to the number of input bits for most significant bit encoder 42 depending upon the number of bits which the thermometer code input contains. Conversions between codes other than thermometer and binary may be readily implemented with the present invention. Those skilled in the art will recognize that modifications and variations can be made without departing from the spirit of the invention. Therefore, it is intended that this invention encompass all such variations and modifications as fall within the scope of the appended claims.

I claim:

1. A digital encoder for encoding a plurality of digital bits from a first digital code format to a second digital code format, comprising:
    an input terminal for receiving a digital input signal in the first digital code format, the digital input signal having a plurality of digital bits;
    a plurality of rank ordered encoder circuits, each of the rank ordered encoder circuits having an input coupled to the input terminal for receiving a predetermined portion of the digital bits corresponding to each of the rank ordered encoder circuits, and each encoder circuit providing an output in response to performing an encoding of the predetermined portion of the digital bits from the first digital code format to the second digital code format;
    bit determination means coupled to the input terminal for determining at least one most significant bit of the second digital code format by using at least one of the digital bits, the at least one of the digital bits not being used by the plurality of rank ordered encoder circuits; and
    means coupled to each of the plurality of rank ordered encoder circuits for selecting the output of one of the encoder circuits in response to the at least one most significant bit of the second digital code format as a remainder of the second digital code format.

2. The digital encoder of claim 1 wherein the first digital code format is a thermometer code and the second digital code format is a binary code.

3. The digital encoder of claim 1 wherein the plurality of rank ordered encoder circuits further comprises four encoder circuits.

4. The digital encoder of claim 1 wherein the digital input signal has sixty-three bits and the predetermined portion of the digital bits which each rank ordered encoder circuit receives is fifteen bits of the sixty-three bits.

5. A method of encoding a first plurality of digital bits from a first digital code format to a second digital code format, comprising the steps of:
    receiving a digital input signal in the first digital code at an input terminal, the digital input signal having the first plurality of digital bits;
    coupling an input of each of a second plurality of rank ordered encoder circuits to the input terminal for receiving a predetermined portion of the digital bits corresponding to each of the rank ordered encoder circuits;
    concurrently performing partitioned encodings of the predetermined portion of the digital bits from the first digital code format to the second digital code format with each of the encoder circuits;
    concurrently determining at least one most significant bit of the second digital code format by using one or more of the digital bits, the one or more of the digital bits not being used to perform the partitioned encodings; and
    selecting one of the partitioned encodings of the predetermined portion of the digital bits in response to the at least one most significant bit of the second digital code format as a remainder of the second digital code format.

6. The method of claim 5 wherein the digital input signal has sixty-three bits and the predetermined portion of the digital bits which each rank ordered encoder circuit receives is fifteen bits of the sixty-three bits.

7. A method of encoding a first plurality of digital bits from a first digital code format to a second digital code format, comprising the steps of:
    receiving a digital input signal in the first digital code at an input terminal, the digital input signal having the first plurality of digital bits;

coupling an input of each of a second plurality of rank ordered encoder circuits to the input terminal for receiving a predetermined portion of the digital bits corresponding to each of the rank ordered encoder circuits;

concurrently performing partitioned encodings of the predetermined portion of the digital bits from the first digital code format to the second digital code format with each of the encoder circuits;

concurrently determining at least one most significant bit of the second digital code format by using one or more of the digital bits which is no greater in number than the second plurality of encoder circuits and which is separate from the predetermined portion of the digital bits which each of the rank ordered encoder circuits receives; and selecting one of the partitioned encodings of the predetermined portion of the digital bits in response to the at least one most significant bit of the second digital code format as a remainder of the second digital code format.

8. A digital encoder for encoding an input signal in thermometer code to an output signal in binary code, comprising:

an input for receiving a digital input signal in thermometer code, the digital signal having a plurality of digital bits;

a partitioned encoder having a plurality of rank ordered encoder circuits, each of the rank ordered encoder circuits having an input for receiving a predetermined portion of the digital bits assigned to each rank ordered encoder circuit, each of the encoder circuits concurrently performing an encoding of the predetermined portion of the digital bits which were received from the thermometer code to the binary code, the partitioned encoder also having a circuit portion for providing at least one most significant bit of the output signal by utilizing one or more of the plurality of digital bits which are not used by the rank ordered encoder circuits; and a multiplexor coupled to each of the encoder circuits of the partitioned encoder, the multiplexor providing an encoding of one of the encoder circuits as a remainder of bits of the output signal in direct response to the at least one most significant bit provided by the circuit portion of the partitioned encoder.

9. The digital encoder of claim 8 wherein the input signal comprises sixty-three bits and the predetermined portion of the digital bits which each rank ordered encoder circuit receives is fifteen bits of the sixty-three bits.

10. The digital encoder of claim 8 wherein the plurality of rank ordered encoder circuits further comprises four encoder circuits.

11. The digital encoder of claim 8 wherein the at least one most significant bit of the output signal further comprises two most significant bits of the output signal.

* * * * *